United States Patent
Kummel et al.

(10) Patent No.: US 12,180,583 B2
(45) Date of Patent: Dec. 31, 2024

(54) METHODS OF FORMING LOW RESISTIVITY TITANIUM NITRIDE THIN FILM IN HORIZONTAL VIAS AND RELATED DEVICES

(71) Applicants: The Regents of the University of California, Oakland, CA (US); Merck Patent GmbH, Darmstadt (DE)

(72) Inventors: Andrew Kummel, San Diego, CA (US); Cheng-Hsuan Kuo, San Diego, CA (US); SeongUk Yun, Carlsbad, CA (US); Ravindra Kanjolia, North Andover, MA (US); Mansour Moinpour, San Jose, CA (US); Daniel Moser, Manitowoc, WI (US)

(73) Assignees: The Regents of the University of California, Oakland, CA (US); Merck Patent GmbH, Darmstadt (DE)

( * ) Notice: Subject to any disclaimer, the term of this patent is extended or adjusted under 35 U.S.C. 154(b) by 120 days.

(21) Appl. No.: 18/062,274

(22) Filed: Dec. 6, 2022

(65) Prior Publication Data
US 2023/0175118 A1 Jun. 8, 2023

Related U.S. Application Data

(60) Provisional application No. 63/286,435, filed on Dec. 6, 2021, provisional application No. 63/367,019, filed on Jun. 24, 2022.

(51) Int. Cl.
*C23C 16/30* (2006.01)
*C23C 16/04* (2006.01)
(Continued)

(52) U.S. Cl.
CPC ............ *C23C 16/045* (2013.01); *C23C 16/34* (2013.01); *C23C 16/52* (2013.01)

(58) Field of Classification Search
CPC ....................................................... C23C 14/06
See application file for complete search history.

(56) References Cited

U.S. PATENT DOCUMENTS

| 7,074,719 B2 | 7/2006 | Kim et al. |
| 2005/0070041 A1* | 3/2005 | Wu ................... C23C 16/45527 438/52 |

(Continued)

OTHER PUBLICATIONS

Chen et al. (2000) Thin Solid Films 376, 115.
(Continued)

*Primary Examiner* — Austin Murata
(74) *Attorney, Agent, or Firm* — Stanek Lemon Crouse & Meeks PA (57) ABSTRACT

A method of forming a conformal layer including TiN in a via includes introducing a precursor into a reaction chamber according to a first exposure schedule. The precursor includes non-halogenated metal-organic titanium. The first exposure schedule indicates precursor exposure periods. Each precursor exposure period is associated with a particular duration of time and a particular duty cycle over which to introduce the precursor during the particular duration of time. The method includes introducing a co-reactant into the reaction chamber according to a second exposure schedule. The co-reactant includes nitrogen. The second exposure schedule indicates co-reactant exposure periods. Each co-reactant exposure period is associated with a particular duration of time and a particular duty cycle over which to introduce the co-reactant during the particular duration of time. The method includes providing the conformal layer including TiN in the via based on said introducing the precursor and the co-reactant.

20 Claims, 9 Drawing Sheets

(51) Int. Cl.
C23C 16/34 (2006.01)
C23C 16/52 (2006.01)

(56) References Cited

U.S. PATENT DOCUMENTS

2010/0003406 A1* 1/2010 Lam ............... C23C 16/45536
427/255.391
2019/0185993 A1 6/2019 Chen et al.

OTHER PUBLICATIONS

Josell et al. (2009) Ann. Rev. Mater. Res. 39, 231.
Gall (2016) J. Appl. Phys. 119, 085101.
Kwak et al. (1999) Thin Solid Films 339, 290.
Lane et al. (2011) J. Mater. Res. 15, 203.
Van der Veen et al. (2018) Proc. of the IITC 2018 DOI: 10.1109/IITC.2018.8430407.
Pedreira et al. (2017) IEEE IRPS 2017 DOI: 10.1109/IRPS.2017.7936340.
Murdoch et al. (2020) IEEE IITC 2020 DOI: 10.1109/IITC47697.2020.9515597.
Lee et al. (2003) Mater. Chem. and Phys. 82, 984.
Green et al. (1985) J. Elec. Soc. 132, 2677.
Khan et al. (2019) Chem. Mater. 30, 7603.
Mackus et al. Chem. Mater. (2019) 31, 2.
Aaltonen et al. Chem. Vap. Depos. (2003) 9, 45.
Kim et al. (2009) J. Korean Phys. Soc. 55, 32.
Popovici et al. Chem. Mater. (2017) 29, 4654.
Gao et al. (2019) Chem. Mater. 31, 1304.
Mm et al. (2008) J. Appl. Phys. 103, 113509.
Hayes et al. (2021) J. Vac. Sci. A 39, 052402.
Wolf et al. (2020) Appl. Surf. Sci. 510, 144804.
Scofield (1976) J. Elec Spectroscopy and Rel. Pheno. 8, 129.
Morgan (2015) Surf. Interface Anal. 47, 1072.
Perloff (1977) Solid-State Elec. 20, 681.
Patterson (1939) Phys. Rev. 56, 978.
Jog and Gall (2021) J. Appl. Phys. 130, 115103.
Jog and Gall (2022) IEEE Trans Elec. Dev. 69, 3854.
Milosevic et al. (2018) J. Appl. Phys. 124, 165105.
Milosevic (2019) J. Appl. Phys. 125, 245105.
Cumpson Surf. Interface Anal. 29, 403.
Powell et al. (1967) J. Less. Common Met. 12, 1.
Moretti 1993) Surf. Interface Anal. 20, 681.
Damayanti et al. (2007) Electrochem. and Solid State Lett. 10, p. 15.
Solina et al. (1997) Adv. X-ray Anal. 40.
Tang and Hess (1984) J. Electrochem Sco . . . 131, 115.
D. Gall. The Search for the Most Conductive Metal for Narrow Interconnect Lines. Journal of Applied Physics. 127, 050901 (2020).
S. Dutta, K. Sankaran, K. Moors, G. Pourtois, S. Elshocht, J.Bommels, W.Vandervorst, Z. Tokei, C. Adelmann. Thickness Depenence of the Resistiity of Platinum-group Metal Thin Films. Journal of Applied Physics. 122, 025107 (2017).
T. Hong, S, Choi, S. Yeo, J. Park, S. Kim, T. Cheon, H. Kim M. Kim, H. Kim. Atomic Layer Deposition of Ru Thin Films Using a Ru(0) Metallorganic Precursor and O2. ECS Journal of Solid State Science and Technology. 2(3) P47-P53 (2013).
M. H. Hayes, J.F. Conley Jr. Properties of Annealed ALD Ru from Ru(DMBD)(CO)3 and Oxygen. ECS Meeting Abstrcts, vol. MA2018-01 (2018).
D. Kwon, C. An, S. Kim, D. Kim, J. Lim, W. Jeon, C. Hwang. Atomic Layer Deposition of Ru Thin Films Using (2,3-imethyloxopentaienyl) (ethycyclopentadienyl)Ru and the Effect of Ammonia Tratment during the Deposition. Journal of Materials Chemistry C. Issue 21, (2020).
I. Zyulkov, M. Krishtab, S. Gendt, S. Armini. Selective Ru ALD as a Catalyst for Sub-Seven-Nanometer Bottom-Up Metal Interconnects. ACS Applied Materials & Interfaces. 9, 31031-31041 (2017).
H. Wang, R. Gordon, R. Alvis, R. M. Ulfig. Atomic Layer Deposition of Ruthenium Thin Films from Amidinate Precursor. Chemical Vapor Deposition, 15, 312-319 (2009).
T. Aaltonen, A. Rahtu, M. Rital, M. Leskela. Reaction Mechanism Studies on Atomic Layer Deposition of Ruthenium and Platinum. Electrochemical and Solid-State Letters 6(0): C130 (2003).
T. Aaltonen, M. Ritala, K. Arstila, J. Keinonen, M. Leskela. Atomic Layer Deposition of Ruthenium Thin Films from Ru (thd)3 and Oxygen. Chemical Vapor Deposition, 10(4), 215-219 (2004).
S. Cwik, K. Woods, M. Saly, T. Knisley, C.H. Winter. Thermal Atomic Layer Deposition of Ruthenium Metal Thin Films using Nonoxidative Coreactants. Journal of Vacuum Science &Technology A38, 012402(2020).
O. Kwon, J. Kim, H. Park, S. Kang. Atomic Layer Deposition of Ruthenium Thin Films for Copper Glue Layer. Journal of Electrochemical Society, 151(2) G109-G112 (2004).
M. Leskela, M. Ritala. Atomic Layer Deposition Chemistry: Recent Developments and Future Challenges. Angewandte Chemie International Edition, 42 (45). (2003).
Moriarty, John L., Journal of Chemical and Engineering Data 62, p. 422 (1963).
Wolf, et al., Low temperature thermal ALD TaNx and TiNx films from anhydrous N2H4, Applied Surface Science, Dec. 31, 2018, vol. 462, pp. 1029-1035.
Stevens, et al., Area-Selective Atomic Layer Deposition of TiN, TiO2, and HfO2 on Silicon Nitride with inhibition on Amorphous Carbon, Chemistry of Materials, Apr. 27, 2018, vol. 30 issue 10, pp. 3223-3232, DOI: 10.1021/acs.chemmater.8b00017.
Lee, et al., Alternative Surface Reaction Route in the Atomic Layer Deposition of Titanium Nitride Thin Films for Electrode Applications, ACS Applied Electronic Materials, Feb. 5, 2021, vol. 3 issue 2, pp. 999-1005, DOI: 10.1021 /acsaelm.0c01079.
Elam, et al., Surface chemistry and film growth during TiN atomic layer deposition using TDMAT and NH3, Thin Solid Films, Jul. 31, 2003, vol. 436 issue 2, pp. 145-156, DOI: 10.1016/S0040-6090(03)00533-9.
Wang, et al., Atomic Vapor Deposition of TiN with Diluted Tetrakis (diethylamido) Titanium (TDEAT) for Phase Change Memory, ECS Transactions, 2009, vol. 22 issue 1, pp. 167-173, DOI: 10.1149/1.3152973.
Chen, et al., Plasma-Enhanced Atomic Layer Deposition (PEALD) of TiN using the Organic Precursor Tetrakis(ethylmethylamido)Titanium (TEMAT), MATEC Web of Conferences, Jan. 13, 2016, vol. 39, article No. 01010, DOI: 10.1051/matecconf/20163901010.
Musschoot, et al., Atomic layer deposition of titanium nitride from TDMAT precursor, Microelectronic Engineering, Jan. 2009, vol. 86 issue 1, pp. 72-77, DOI: 10.1016/j.mee.2008.09.036.
Hao, et al., Study on influences of TiN capping layer on time-dependent dielectic breakdown characteristic of ultra-thin EOT high-k metal gate NMOSFET with kMC TDDB simulations, Chinese Physics B, 2016, vol. 25 issue 8, article No. 087305, DOI: 10.1088/1674-1056/25/8/087305.

* cited by examiner

METHODS OF FORMING LOW RESISTIVITY TITANIUM NITRIDE THIN FILM IN HORIZONTAL VIAS AND RELATED DEVICES

CROSS-REFERENCE TO RELATED APPLICATIONS

This application claims the benefit of U.S. Provisional Application No. 63/286,435, entitled METHODS OF FORMING LOW RESISTIVITY TiN THIN FILMS ON PATTERNED SUBSTRATES USING THERMAL ALD AND RELATED STRUCTURES, filed Dec. 6, 2021, and U.S. Provisional Application No. 63/367,019, entitled METHODS OF FORMING LOW RESISTIVITY TITANIUM NITRIDE THIN FILM BY ATOMIC LAYER DEPOSITION WITH TICL4 AND METAL-ORGANIC PRECURSORS IN HORIZONTAL VIAS AND RELATED DEVICES, filed Jun. 24, 2021, each of which is hereby incorporated herein by reference.

STATEMENT OF GOVERNMENT SUPPORT

This invention was made with government support under Grant No. HR0011-18-3-0004 awarded by the Department of Defense/Defense Advanced Research Projects Agency (DARPA). The government has certain rights in the invention.

BACKGROUND

In semiconductors, Titanium nitride (TiN) thin films are a conducting material that can be utilized for several applications including, but not limited to, Tungsten (W), Cobalt (Co), and Copper (Cu) diffusion barrier liners for vias, barrier metal for high density NAND flash memory devices, or other 3D structures (e.g., re-entrant undercut structures) in which a metal diffusion barrier is needed or desired (e.g., 3D NAND, 3D DRAM, Gate All Around (GAA), and Si nanowire gate stacks). In some cases, low resistivity TiN is deposited using physical vapor deposition (PVD) (e.g., sputtering) or atomic layer deposition (ALD) with Titanium tetrachloride ($TiCl_4$) and Ammonia ($NH_3$). For low resistivity TiN thin films, a low concentration of impurities such as oxygen, carbon, and chlorine are often required for low resistivity. Plasma-Enhanced ALD (PE-ALD) is typically employed to reduce the resistivity by removing the surface impurities of the TiN films and by increasing their crystallinity. However, PE-ALD is often not suitable for use in patterned substrates, such as those with horizontal vias, since charged particles neutralize and radicals recombine when in contact with substrate surfaces. Consequently, for TiN deposition in horizontal vias, thermal ALD may be required.

Several ALD methods have been reported for depositing low-resistivity TiN thin films. Thermal ALD using $TiCl_4$ and $N_2H_4$ as well as TDMAT and $N_2H_4$ has been explored. Some findings indicate that high temperatures (500° C.) are required to deposit low resistivity films using ALD with $TiCl_4$ and $NH_3$. Some findings hypothesized that TiN with resistivity ~150 uΩ-cm can be deposited since $TiCl_4$ reacts with $H_2S$ to form $TiS_2$ which can form hydrogen and nitrogen radicals which remove surface impurities. However, $H_2S$ is a highly toxic precursor that many in the industry prefer not to employ. Some findings reported using other Ti precursors (TDMAT and TDEAT).

SUMMARY

Various embodiments of systems, methods, and devices within the scope of the appended claims each have several aspects, no single one of which is solely responsible for the desirable attributes described herein. Without limiting the scope of the appended claims, some prominent features are described herein.

Disclosed herein are systems and methods for fabricating conformal, low resistivity titanium nitride (TiN) thin film in horizontal vias using thermal atomic layer deposition (ALD) with non-corrosive metal-organic precursors. Disclosed herein are semiconductor memory devices having horizontal vias with low resistivity titanium nitride (TiN) thin film.

Disclosed herein are methods for growing titanium nitride (TiN) thin films by thermal ALD using titanium tetrachloride ($TiCl_4$) or organic precursors and anhydrous hydrazine ($N_2H_4$). For 425° C. $TiCl_4$ ALD, the resistivity of TiN thin films is around 160 uΩ-cm while for 500° C. $TiCl_4$ ALD, the resistivity is reduced to 90 uΩ-cm. The lowest resistivity using TDMAT, TDEAT, and TEMATi ALD are 400 uΩ-cm and 295 uΩ-cm, and 220 uΩ-cm, respectively, when used with $N_2H_4$ as a co-reactant; these correlated well with the maximum ALD temperatures. Benchmarking of TiN ALD techniques based on thin film resistivity thus indicates that using $N_2H_4$ in place of $NH_3$ can produce films with lower resistivity. Conformal TiN (~4 nm) thin films were grown by thermal ALD process using $TiCl_4$ or TEMATi and $N_2H_4$ in horizontal vias in patterned samples.

BRIEF DESCRIPTION OF THE DRAWINGS

The present disclosure is illustrated by way of example, and not limitation, in the figures of the accompanying drawings, in which like reference numerals indicate similar elements and in which.

DETAILED DESCRIPTION

The foregoing and other aspects of the present invention will now be described in more detail with respect to other embodiments described herein. It should be appreciated that the invention can be embodied in different forms and should not be construed as limited to the embodiments set forth herein. Rather, these embodiments are provided so that this disclosure will be thorough and complete, and will fully convey the scope of the invention to those skilled in the art.

EXAMPLES

In a study, 300 nm thick $SiO_2$ grown on Si substrates provided by University Wafers were used as substrates for deposition of TiN thin films, and the patterned substrates were provided by Micron. The standard degreasing method was applied to clean the substrate before deposition which consisted of quick rinses in acetone, methanol, and DI water for 1 minute in each step. A high-purity nitrogen gun was used to remove the residual liquids or dust on the substrate before loading it into the load lock. Before transferring the substrate to the deposition chamber, a mechanical pump was utilized to reduce the pressure of the load lock to 0.1 Torr to prevent the oxygen from entering the main chamber. The deposition chamber was pumped continuously by a turbopump at base pressure as low as $1\times10^{-6}$ Torr. The chamber was heated to ~130° C. to prevent the condensation of the precursor onto the side wall of the chamber.

For the nitrogen source, high purity $N_2H_4$ (Rasirc, Brute Hydrazine®) was used. A purifier (Entegris, CE2500KFI4R) was installed to keep the oxygen concentration as low as possible. Commercial $TiCl_4$ (Sigma-Aldrich) precursor was used as Ti source precursor. For metal-organic precursors, TDMAT (tetrakis(dimethylamino)titanium), TDEAT (tetrakis(diethylamino)titanium) and TEMATi (tetrakis(ethylmethylamido)titanium) were provided by Sigma-Aldrich. A low temperature process precursors is required for these halogen-free to prevent the decomposition. Ultrahigh purity $N_2$ was passed through another purifier (Entegris, GPUS35FIX04R02CA) to act as the purge gas during the deposition. The flow rate of the purge gas was controlled by a MFC (Mass Flow Controller) to ensure stable flow of the purge gas.

Figure 1:
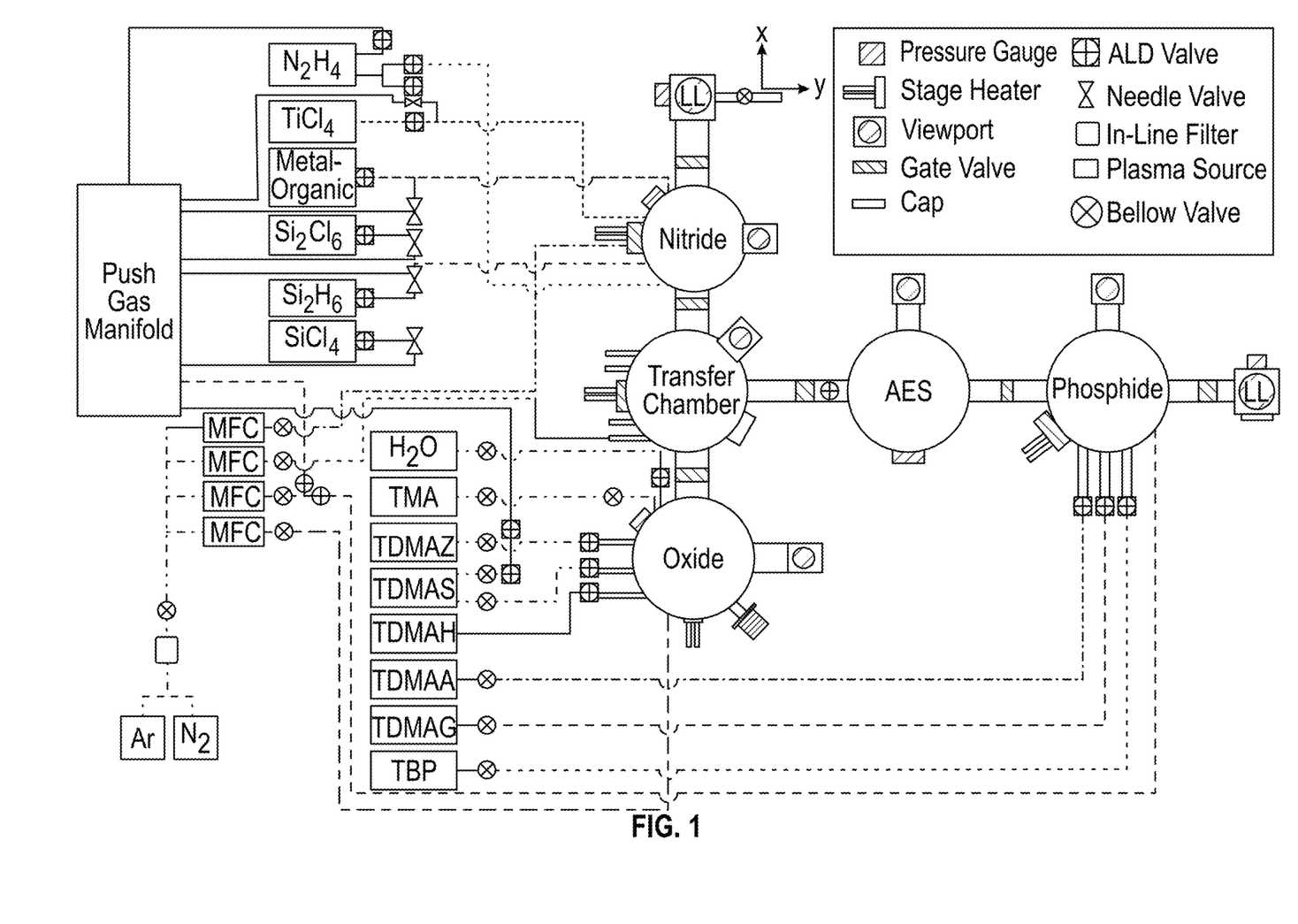
FIG. 1 illustrates a schematic of an example deposition chamber connected to an in-situ Auger electron spectrometer to determine the atomic composition of ALD TiN.

FIG. 1 illustrates a schematic of an example deposition chamber connected to an in-situ Auger electron spectrometer to determine the atomic composition of ALD TiN. After the deposition in the nitride chamber, samples were transferred to the transfer chamber by the transfer arm in the x-axis. Subsequently, another transfer arm in the y-axis was employed to transfer the sample from the transfer chamber to the AES chamber and PEALD chamber. Ar plasma treatment was conducted in the PEALD at 300° C. and −100V.

Ex-situ AFM (Atomic Force Microscopy) was used to characterize the surface roughness of the TiN thin films. The thickness of the TiN thin film was measured by the XRR (X-Ray Reflectivity). The sheet resistance of the TiN thin film was calculated by the modified four-point probe system (Ossila). With the thickness and sheet resistance of the thin film, resistivity was calculated. Note the resistivity was measured after exposure to air for around 15 minutes so the actual thickness as well as the sheet resistance may be smaller since the top few nanometers on the surface may be oxidized and converted to $TiO_xN_y$ which has high resistivity. FIB (focused Ion beam) was used for TEM sample preparation. During the process, Ir and Pt were deposited as protection layers. TEM was employed to check the conformality of the TiN thin film in the horizontal vias. EDX was used to analyze the composition of the thin films in the horizontal vias.

Figure 2:
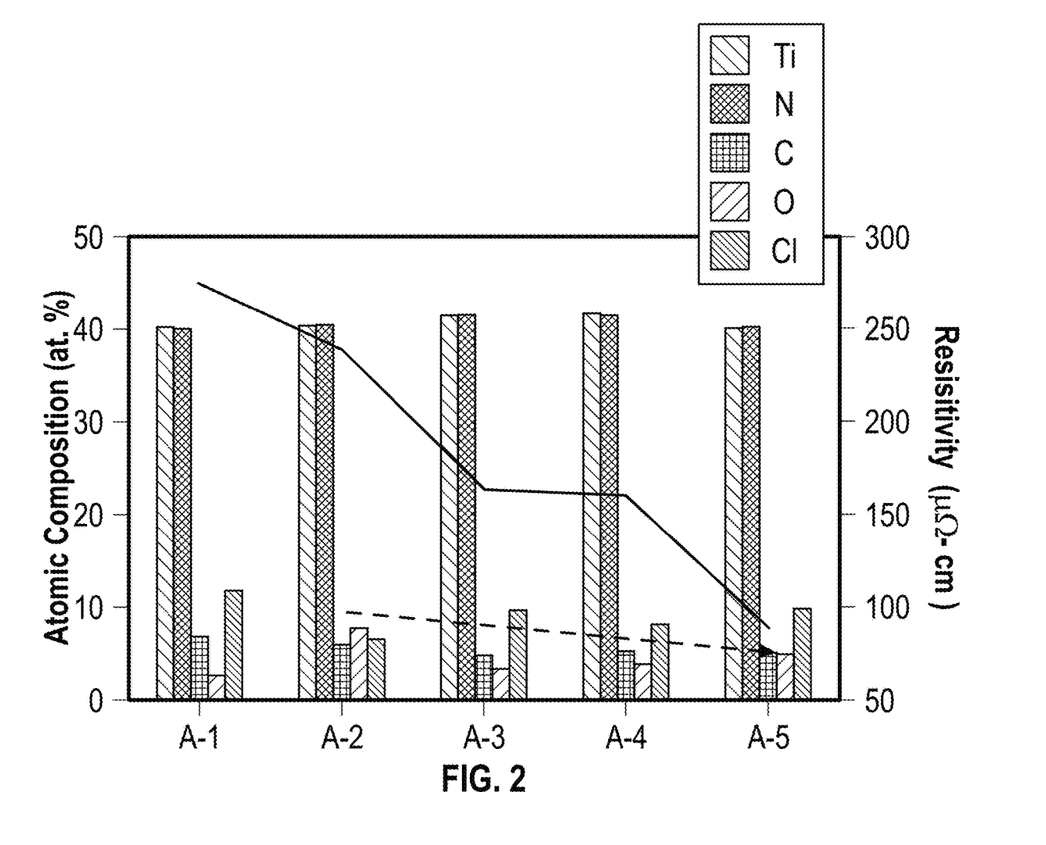
FIG. 2 illustrates results of a pulse length study of TiN using $TiCl_4$ and $N_2H_4$.

FIG. 2 illustrates results of a pulse length study of TiN using $TiCl_4$ and $N_2H_4$. In this example, $TiCl_4$ was employed as a benchmark. At first, TiN thin films were optimized at 425° C. By increasing the pulse length of the $N_2H_4$ from 1.2 s to 3.6 s, the resistivity of TiN decreased which correlated with a decrease in oxygen concentration. No significant effects of further increase of $N_2H_4$ pulse length to 7.2 s were observed. To compare the result of Ahn, the deposition temperature was increased 500° C. For 500° C. ALD, surface impurities such as oxygen and chlorine were comparable to the sample at 425° C. However, the resistivity was reduced to less than 90 uΩ-cm which was comparable to Ahn's result. Low resistivity was ascribed to the high deposition temperature (500° C.) and to low oxygen and carbon contamination allowing for the development of larger crystallites. Note that the resistivity was only constant for $N_2H_4$ pulse lengths greater than 3.6 s consistent with the need for excess $N_2H_4$ to reduce O and Cl contaminants.

Table 1, below, illustrates the process condition matrix of TiN using $TiCl_4$ with $N_2H_4$. At first, the optimization of precursor pulse length was conducted. Afterwards, a high temperature process (~500° C.) was performed (sample A-5) to compared to Ahn's result.

TABLE 1

The process condition matrix of TiN using $TiCl_4$ with $N_2H_4$.

| Sample | $TiCl_4$ pulse length(ms) | $N_2H_4$ pulse length(ms) | Temperature (degree C.) |
|---|---|---|---|
| A-1 | 300 | 1200 | 425 |
| A-2 | 300 | 2400 | 425 |
| A-3 | 300 | 3600 | 425 |
| A-4 | 300 | 7200 | 425 |
| A-5 | 300 | 3600 | 500 |

Figure 3A:
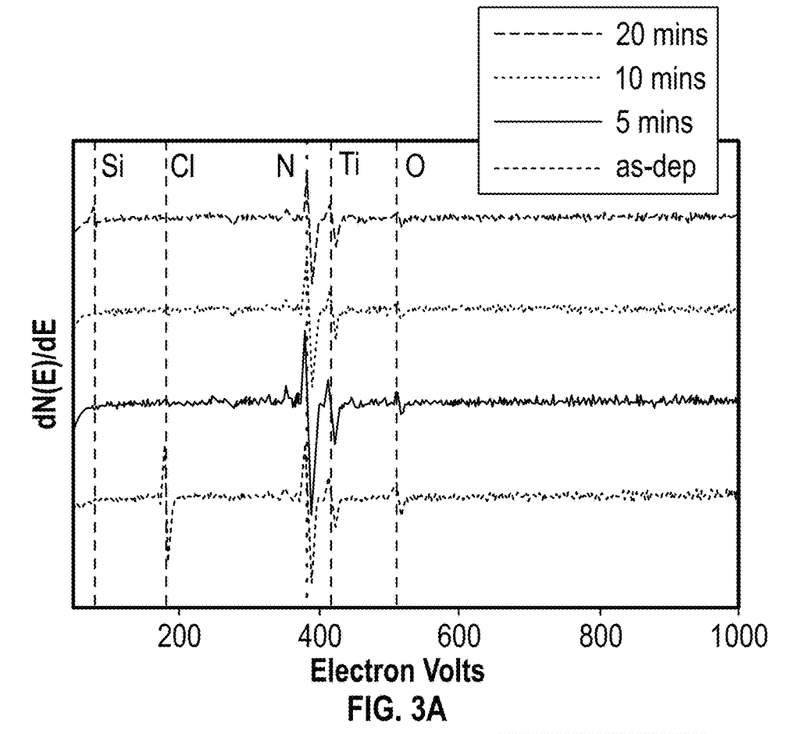
FIG. 3A illustrates post-deposition surface treatment using Ar plasma at 50 W with DC bias −100V.

FIG. 3A illustrates post-deposition surface treatment using Ar plasma at 50W with DC bias −100V. Post-deposition Ar plasma sputtering was utilized at 300° C. to remove the surface impurities such as chlorine from 15 nm thick TiN samples deposited using $TiCl_4+N_2H_4$ at 425° C. AES shows that after 5 minutes of treatment, Cl was greatly reduced. This supports the hypothesis that these impurities are mainly on the surface because they were readily be removed by Ar plasma. However, the Si signal located at ~90 eV was be detected after Ar plasma treatment for 20 minutes indicating sputter removal of the TiN film by the 20 minute Ar plasma consistent with the 5 minute treatment just removing a small surface layer containing chlorine and reducing oxygen.

Figure 3B:
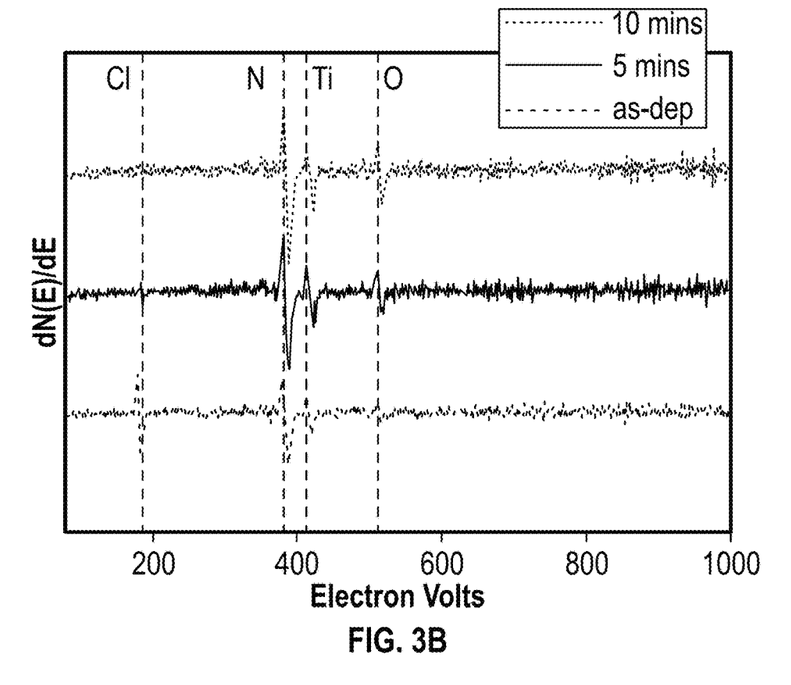
FIG. 3B illustrates post-deposition surface treatment using atomic hydrogen treatment on ~15 nm TiN thin films.

FIG. 3B illustrates post-deposition surface treatment using atomic hydrogen treatment on ~15 nm TiN thin films. For atomic hydrogen treatment, the signal of Cl was significantly removed after 5-min treatment. However, it is observed that the oxygen content went up probably due background oxygen substitute for Cl to maintain Al in a +3 oxidation state. Both surface treatments effectively decreased the Cl content in the thin films. This phenomena strengthened the idea that Cl mainly existed on the surface of the thin films.

As shown by FIGS. 3A and 3B, the removal of surface impurities: O and Cl was achieved after 5 mins Ar plasma treatment. The ratio of Ti to N was comparable to as-dep sample. However, Si substrate peak was observed after 20 mins treatment indicating the sputtering of the TiN thin films. By using atomic hydrogen, the removal of surface Cl impurities was achieved after 5 mins treatment but oxygen content was slightly increased. The starting 15 nm TiN films were prepared using $TiCl_4+N_2H_4$ at 425° C.

Figure 4:
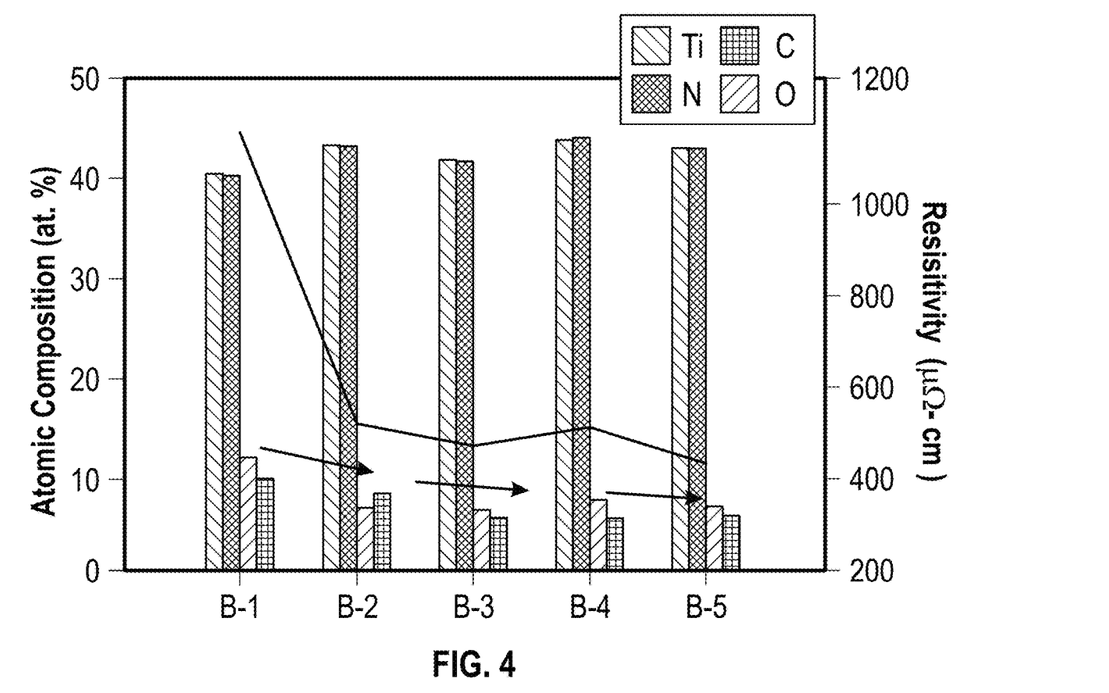
FIG. 4 illustrates results of a pulse length study of TiN using TDMAT study of TiN using TDMAT and N2H4.

FIG. 4 illustrates results of a pulse length study of TiN using TDMAT study of TiN using TDMAT and $N_2H_4$. Due to the low thermal stability of the precursor, lower substrate temperature (350° C.) as well as short TDMAT pulses were employed to avoid the decomposition of the precursor (yellow arrow). A minimum in carbon content and resistivity were observed by decreasing the TDMAT pulse length to 125 ms. The deposition of TiN using TDMAT at 350° C. is shown in FIG. 4; low temperature was needed to prevent precursor decomposition that leads to carbon contamination. At shorter TDMAT pulse lengths, the TiN resistivity was reduced due to decreased carbon and oxygen contents. Even for optimized pulse lengths, the surface oxygen and carbon for TDMAT-based films were greater than for $TiCl_4$-based films.

Table 2, below, illustrates the process condition matrix of TiN using TDMAT with $N_2H_4$. Pulse length of TDMAT was optimized at low temperature to avoid precursor decomposition. More ALD cycles were required for low pulse length samples to reach the same thickness (~15 nm).

TABLE 2

The process condition matrix of TiN using TDMAT with $N_2H_4$.

| Sample | TDMAT pulse length(ms) | $N_2H_4$ pulse length(ms) | Temperature (degree C.) |
|---|---|---|---|
| B-1 | 500 | 6000 | 350 |
| B-2 | 250 | 6000 | 350 |
| B-3 | 125 | 6000 | 350 |
| B-4 | 60 | 6000 | 350 |
| B-5 | 30 | 6000 | 350 |

Figure 5:
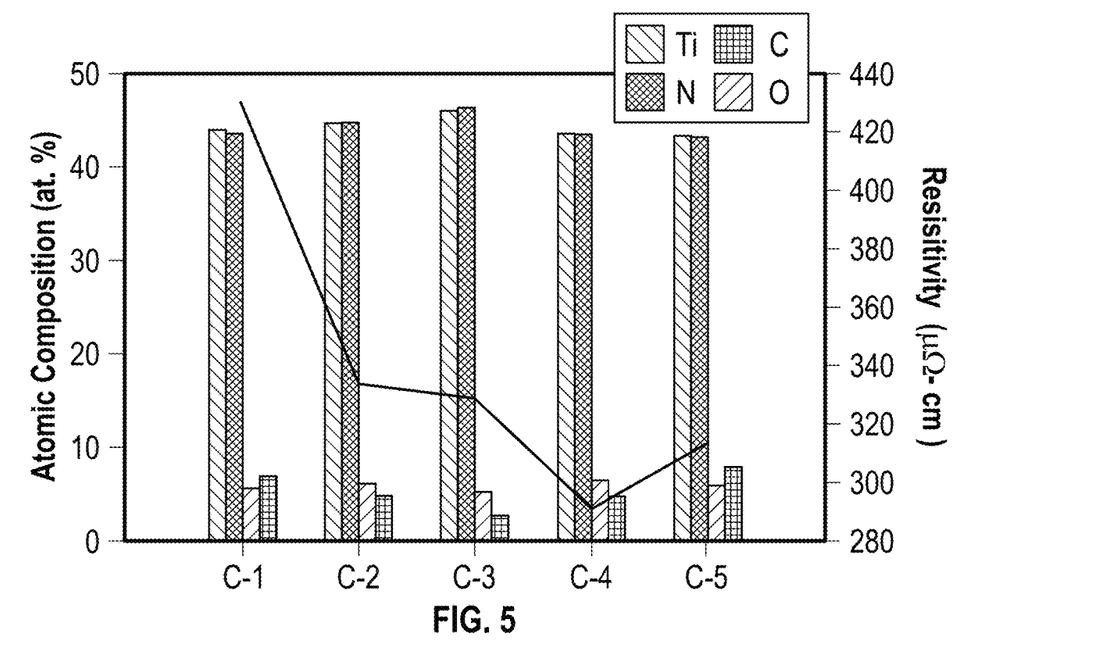
FIG. 5 illustrates results of a pulse length and deposition temperature study of TiN using TDEAT and N2H4.

FIG. 5 illustrates results of a pulse length and deposition temperature study of TiN using TDEAT and N2H4. The pulse length of TiDEAT precursor was optimized with constant pulse length of $N_2H_4$ at different temperatures. A minimum in carbon content and resistivity were observed at 300° C. by decreasing the TDEAT pulse length to 150 ms. However, the resistivity was further decreased by raising the substrate temperature to 350° C. despite an increase in surface carbon content.

TDEAT has higher thermal stability and higher decomposition temperature (350° C.) than TDMAT so it was tested at 350° C. and 400° C. as shown in FIG. 5. While the TDEAT films had lower resistivity than TDMAT films at 350° C., the TDEAT film resistivity increased for 400° C. deposition temperature due to the high carbon content consistent with decomposition of the TDEAT precursor at 400° C. (note higher C content in experiment E).

Table 3, below, illustrates the process condition matrix of TiN using TDEAT with $N_2H_4$. The pulse length of $N_2H_4$ remained constant at 6000 ms. The pulse length of metal-organic precursor was gradually decreased to avoid the precursor decomposition. Temperature was optimized to reach the lowest resistivity at 400° C.

TABLE 3

The process condition matrix of TiN using TDEAT with $N_2H_4$.

| Sample | TDEAT pulse length(ms) | $N_2H_4$ pulse length(ms) | Temperature (degree C.) |
|---|---|---|---|
| C-1 | 600 | 6000 | 300 |
| C-2 | 300 | 6000 | 300 |
| C-3 | 150 | 6000 | 300 |
| C-4 | 150 | 6000 | 350 |
| C-5 | 150 | 6000 | 400 |

Figure 6:
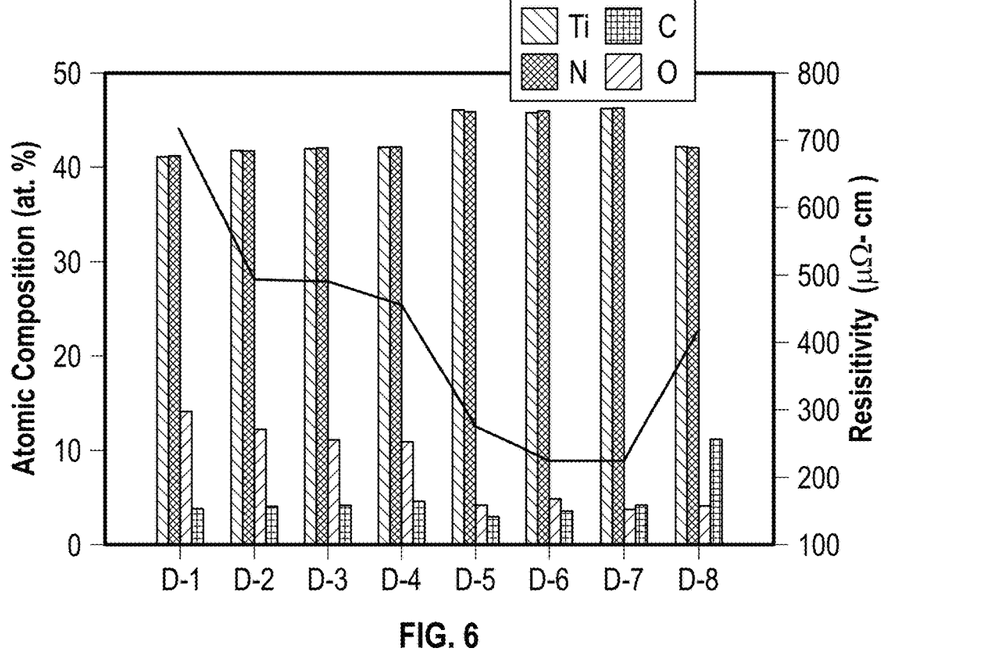
FIG. 6 illustrates results of a pulse length and deposition temperature study of TiN using TEMATi and $N_2H_4$.

FIG. 6 illustrates results of a pulse length and deposition temperature study of TiN using TEMATi and $N_2H_4$. The pulse lengths of both precursors were optimized at increasing temperatures to minimize the resistivity each highest substrate temperature. As the substrate temperature was increased, the lowest resistivity was observed with increasing $N_2H_4$ pulse length.

The optimal metal-organic precursor was found to be TEMATi, as shown in FIG. 6. To reach the lowest resistivity, optimization of the pulse lengths of both precursors were first conducted at 300° C. No decomposition of the TEMATi was observed at low temperature. Consequently, substrate temperatures were increased step by step until the carbon content in the thin films increased to 13% resulting in high resistivity at 450° C. As the substrate temperature increased, the optimal pulse length of $N_2H_4$ increased for lowest reactivity consistent with precursor mediated chemisorption of $N_2H_4$. At 425° C., the nucleation of the precursor is not saturated when the pulse length of TEMATi was decreased to 200 ms. Therefore, sample F was the optimized condition at 425° C.

Table 4, below, illustrates the process condition matrix of TiN using TEMATi with $N_2H_4$. Pulse length and temperature optimization were performed to lower the resistivity. However, TEMATi precursor will decompose at 450° C. leading to high carbon content and high resistivity at 450° C.

TABLE 4

The process condition matrix of TiN using TEMATi with $N_2H_4$.

| Sample | TEMATi pulse length(ms) | $N_2H_4$ pulse length(ms) | Temperature (degree C.) |
|---|---|---|---|
| D-1 | 300 | 1200 | 300 |
| D-2 | 300 | 1200 | 350 |
| D-3 | 300 | 3600 | 350 |
| D-4 | 300 | 3600 | 400 |
| D-5 | 300 | 6000 | 400 |
| D-6 | 300 | 6000 | 425 |
| D-7 | 200 | 6000 | 425 |
| D-8 | 300 | 6000 | 450 |

Figure 7:
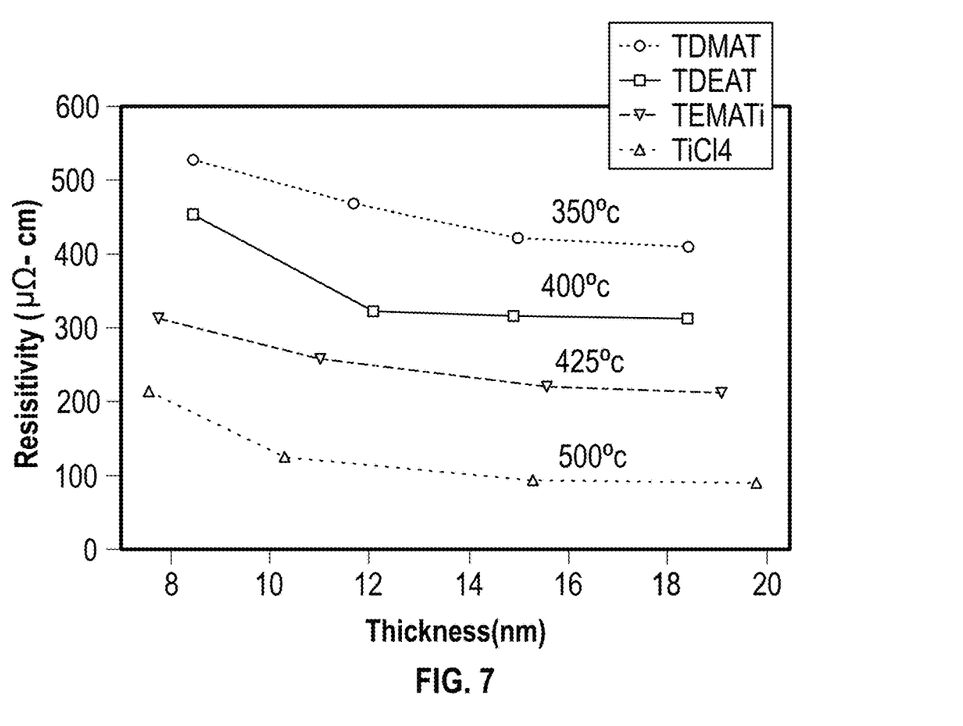
FIG. 7 illustrates a comparison of resistivity for TiN using $TiCl_4$ as well as metal-organic precursors.

FIG. 7 illustrates a comparison of resistivity for TiN using $TiCl_4$ as well as metal-organic precursors. As shown, when the thickness of the thin films reached around 15 nm, the resistivity was minimized. Among all metal-organic precursors, TEMATi produced films with the lowest resistivity, ~220 uΩ-cm consistent with the relatively high thermal stability of the precursor enabling 425° C. deposition temperature. It is hypothesized that the crystallinity of deposited TiN using TEMATi could be improved relative to those deposited using TDEAT or TDMAT due to the higher process temperature while still minimizing carbon incorporation. It is noted that the residual carbon and oxygen in the optimized 425° C. TEMATi+$N_2H_4$ films were comparable to that in the optimized $TiCl_4+N_2H_4$ films at 425° C. ALD temperature.

Figure 8:
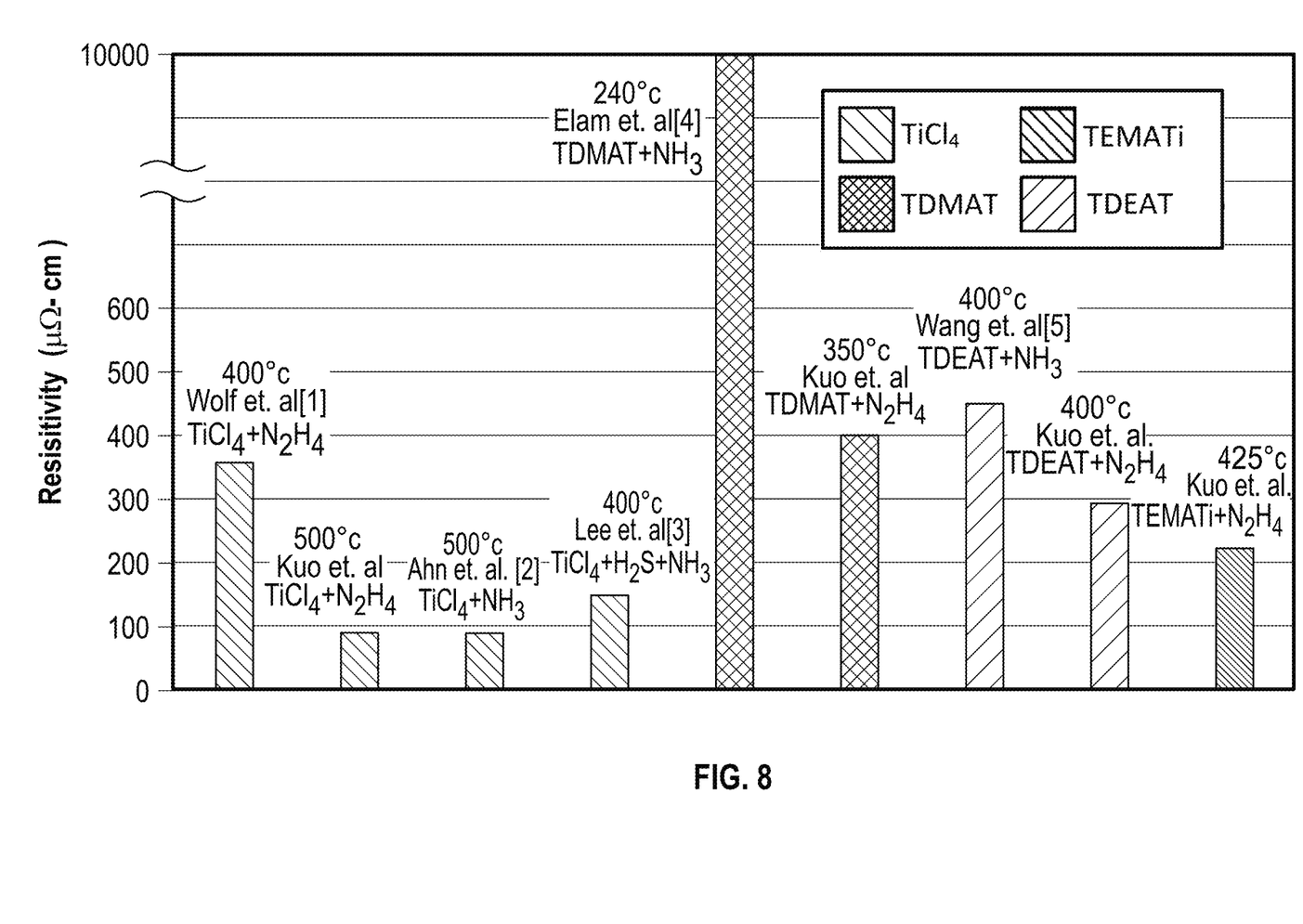
FIG. 8 illustrates a benchmark of the TiN using different precursors.

FIG. 8 illustrates a benchmark of the TiN using different precursors (TiCl$_4$; TDMAT; TDEAT; TEMATi). In this example, the thickness of the thin films was around 15 nm to make sure surface oxidation effects are minimal. Note, temperature can play an important role in terms of the resistivity. As shown in FIG. 8, the resistivity increased below 15 nm; this is consistent with due the top 2 to 3 nm of the surface being oxidized by air exposure. It is also possible that the thinner films had more surface scattering thereby increasing resistivity. For TiCl$_4$, the resistivity was reduced to ~90 uohm-cm with the 500° C. ALD process; this result is comparable to Ahn.

To compare the resistivity of TiN using thermal ALD with different precursors, the benchmarking of the TiN ALD is shown in FIG. 8. Temperature is a critical factor that directly affects the resistivity of the TiN. It is hypothesized that at higher temperature, better crystallinity could be achieved resulting in low resistivity. Among, all halogen-free precursors, the thermal stability of TEMATi is higher enabling this precursor to be employed at higher temperature compared to the other precursor consistent with lower resistivity compared to all other organic precursors.

Patterned samples with horizontal vias were used to verify the conformality of the low-resistivity TiN thin films.

Figure 9A:
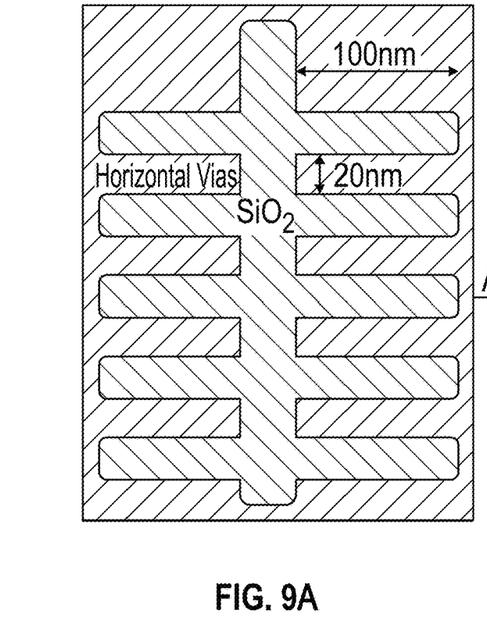
FIGS. 9A and 9B show a cross-sectional diagram of the structure of horizontal vias in the patterned samples before and after the ALD deposition, respectively.
Figure 9B:
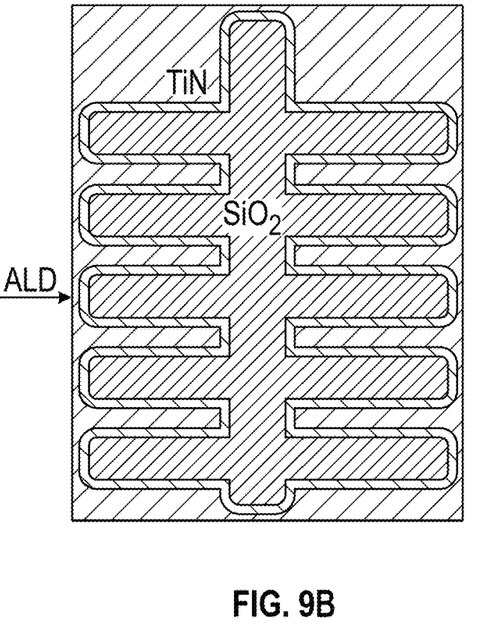

FIGS. 9A and 9B show a cross-sectional diagram of the structure of horizontal vias in the patterned samples before and after the ALD deposition, respectively. The fin structure is made of SiO$_2$ with an aspect ratio of around 5:1. TiN thin films were deposited in the top region, horizontal vias, and the bottom part of the patterned structure. TiN thin films are deposited in the horizontal vias by thermal ALD, which is shown by the uniform exterior section of the Christmas tree shaped region in FIG. 9B.

Figure 9C:
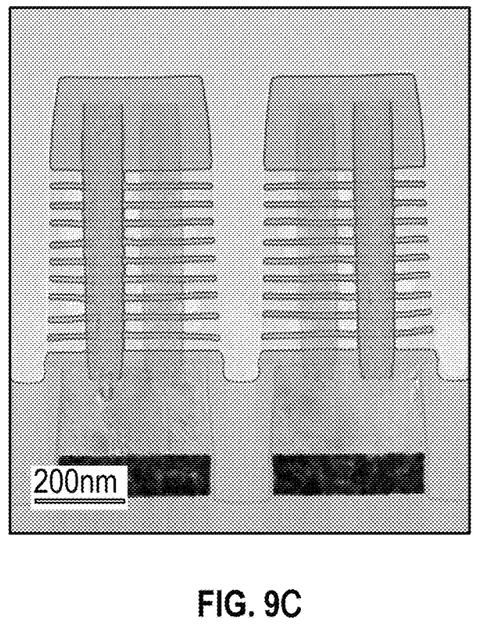
FIG. 9C shows a cross sectional TEM image after deposition for $TiCl_4$ and $N_2H_4$ at 425° C.

FIG. 9C shows a cross sectional TEM image after deposition for TiCl$_4$ and N$_2$H$_4$ at 425° C.

Figure 10:
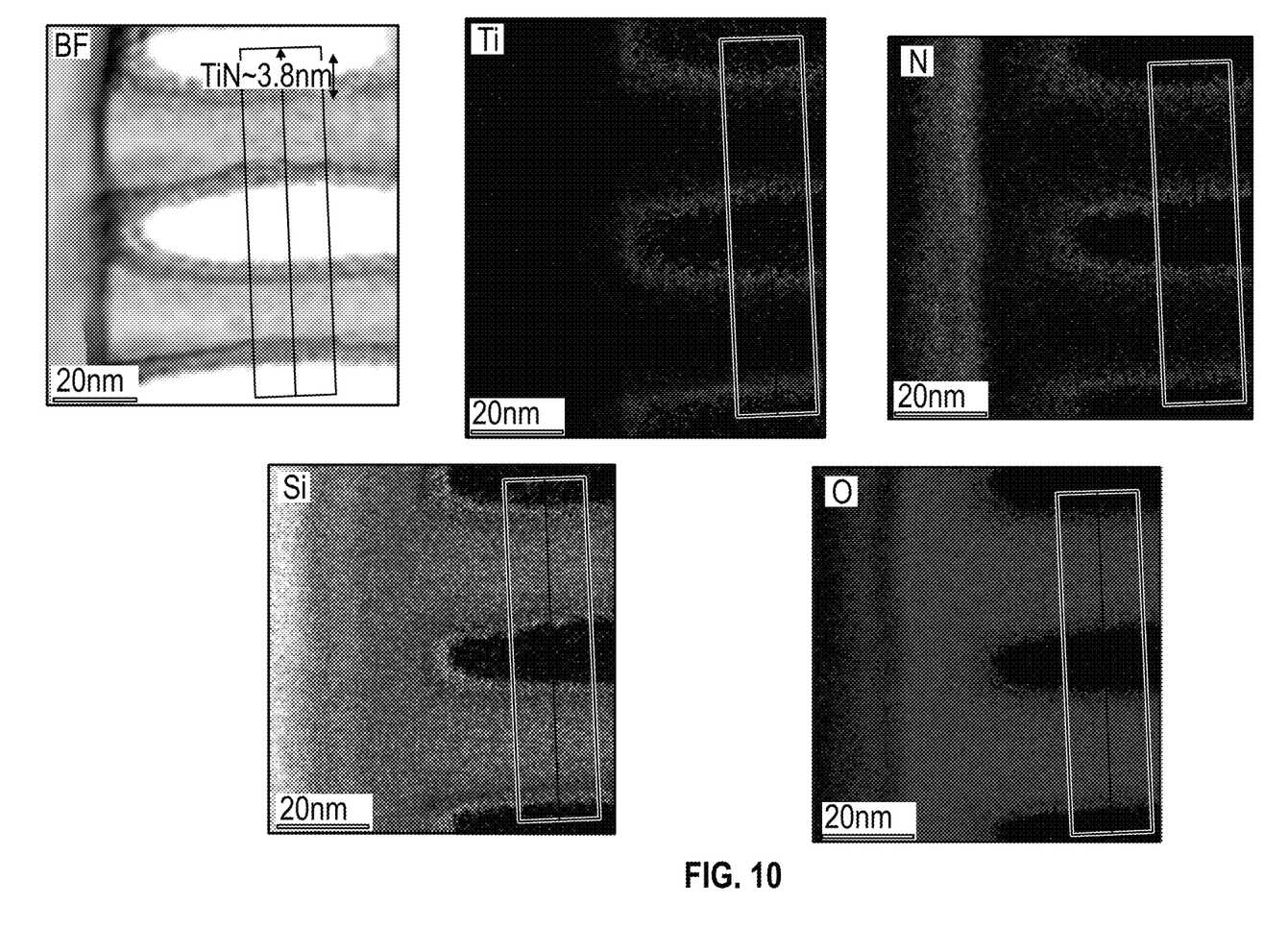
FIG. 10 shows BF TEM and EDX of TiN using $TiCl_4$ and $N_2H_4$ in the horizontal vias at 425° C.

FIG. 10 shows BF TEM and EDX of TiN using TiCl$_4$ and N$_2$H$_4$ in the horizontal vias at 425° C. BF-TEM shows that the thickness of TiN in the horizontal vias is around 3.8 nm. EDX mapping in the bottom left rectangular region supports the chemical composition of the TiN thin film. The fins are SiO$_2$.

A high conformality TiN thin film (~3.8 nm) was deposited in horizontal vias using TiCl$_4$+N$_2$H$_4$ at 425° C. TEM and EDX results support that TiN thin film was conformally grown on the wall in the horizontal vias. BF-TEM of the fins at the thinner edge of lamella is shown. EDX mapping in the green rectangular region shows that fins were SiO$_2$ and the thin film that was conformally grown in the horizontal via was TiO$_x$N$_y$. Note that the films were exposed to atmosphere for several days for the FIB sample preparation and TEM analysis; therefore, the very thin deposited TiN was transformed to TiO$_x$N$_y$ which was observed in the TEM/EDX.

Figure 11A:
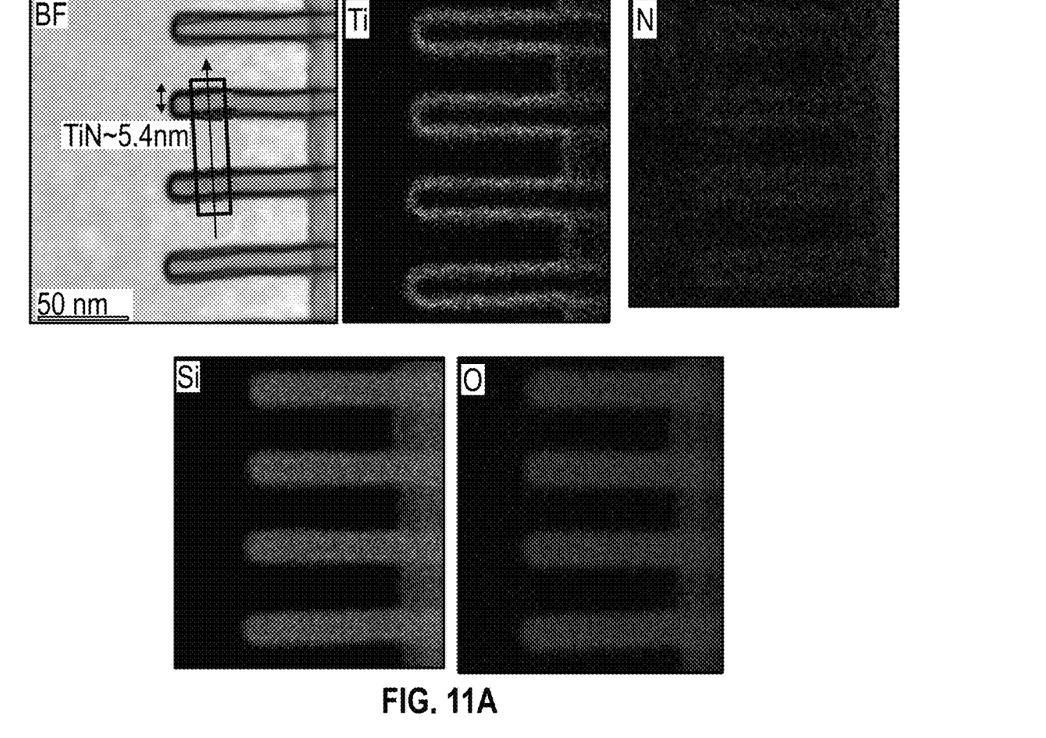
FIG. 11A shows BF TEM and EDX of TiN using TEMATi and $N_2H_4$ in the horizontal vias at 425° C.
Figure 11B:
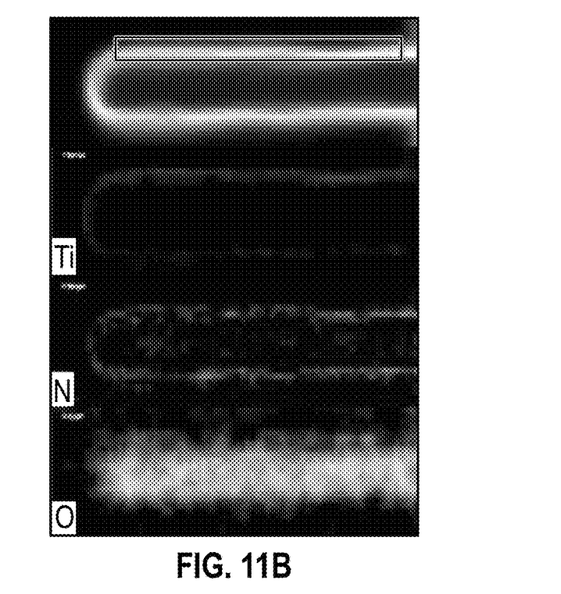
FIG. 11B shows EELS of TiN in the bounded rectangular region.

FIG. 11A shows BF TEM and EDX of TiN using TEMATi and N$_2$H$_4$ in the horizontal vias at 425° C. FIG. 11B shows EELS of TiN in the rectangular region. Ti and N were qualitatively analyzed through EELS. However, nitrogen signal to not strong enough to quantitatively calculate the chemical composition of the thin film in the horizontal vias.

For metal-organic precursor, a high conformality TiN thin film (~5.4 nm) was deposited in horizontal vias using TEMATi+N$_2$H$_4$ at 425° C. The BF-TEM images show TiN with high contrast compared to the fins was conformally deposited in the horizontal vias. EDX mapping of the green region indicates that TiN is grown in the horizontal vias although the signal of nitrogen is weak which is due to the oxidation during the sample preparation and TEM analysis. To further confirm the chemical composition, EELS was utilized to confirm the existence of TiN in the horizontal vias which is shown in FIG. 11B. In the rectangular region, chemical composition was qualitatively analyzed by EELS. The signal of the nitrogen is too weak to get quantitative results which is probably due to the surface oxidation of the thin film.

TiN thin film with record low resistivity at 500° C. were deposited by ALD. Surface impurities such as oxygen and chlorine played crucial roles in the resistivity. By increasing the exposure to a highly reactive nitrogen source, N$_2$H$_4$, the oxygen content in the TiN thin films could be suppressed. Several metal-organic precursors such as TDMAT, TDEAT, and TEMATi were tested. By minimizing the pulse length of the Ti precursor, the surface carbon content was reduced. The organic Ti precursor with the highest thermal stability is required to deposit ALD TiN films with the lowest resistivity. ALD using TEMATi 425° C. deposited TiN films with both the lowest carbon content and lowest resistivity (~220 uohm-cm) compared to other organic Ti precursors. For conformality test, TEM was applied to examine the growth of TiN in the horizontal vias of the patterned substrates. Conformal TiN was deposited in the vias with 3.8 nm and 5.4 nm by using TiCl$_4$ and TEMATi at 425° C.

EXAMPLES

Embodiments of the present disclosure can be described in view of the following clauses:

Clause 1. A method of forming a conformal layer including titanium nitride (TiN) in a via on a substrate in a reaction chamber comprising:
  introducing a precursor into the reaction chamber according to a first exposure schedule, wherein the precursor includes non-halogenated metal-organic titanium, wherein the first exposure schedule indicates a plurality of precursor exposure periods, wherein each precursor exposure period of the plurality of precursor exposure periods is associated with a particular duration of time and a particular duty cycle over which to introduce the precursor into the reaction chamber during the particular duration of time;
  introducing a co-reactant into the reaction chamber according to a second exposure schedule, wherein the co-reactant includes nitrogen, wherein the second exposure schedule indicates a plurality of co-reactant exposure periods, wherein each co-reactant exposure period of the plurality of co-reactant exposure periods is associated with a particular duration of time and a particular duty cycle over which to introduce the co-reactant into the reaction chamber during the particular duration of time; and
  providing the conformal layer including TiN in the via based on said introducing a precursor into the reaction chamber said introducing the co-reactant into the reaction chamber.

Clause 2. The method of any of the previous clauses, wherein the first exposure schedule indicates that the particular duration of time is between about 30 ms and about 500 ms.

Clause 3. The method of any of the previous clauses, wherein the first exposure schedule indicates that the particular duration of time is between about 60 ms and about 300 ms.

Clause 4. The method of any of the previous clauses, wherein the first exposure schedule indicates that the particular duration of time is between about 100 ms and about 250 ms.

Clause 5. The method of any of the previous clauses, wherein the first exposure schedule indicates that the particular duration of time is less than one of 600 ms, 500 ms, 450 ms, 400 ms, 350 ms, 300 ms, 250 ms, 200 ms, 150 ms, or 100 ms.

Clause 6. The method of any of the previous clauses, wherein the first exposure schedule indicates that the particular duration of time is about 125 ms.

Clause 7. The method of clause 6, wherein the precursor is TDMAT

Clause 8. The method of any of the previous clauses, wherein the first exposure schedule indicates that the particular duration of time is about 150 ms.

Clause 9. The method of clause 8, wherein the precursor is TDEAT.

Clause 10. The method of any of the previous clauses, wherein the first exposure schedule indicates that the particular duration of time is about 200 ms.

Clause 11. The method of clause 10, wherein the precursor is TEMATi.

Clause 12. The method of any of the previous clauses, wherein the second exposure schedule indicates that the particular duration of time is greater than 1200 ms.

Clause 13. The method of any of the previous clauses, wherein the second exposure schedule indicates that the particular duration of time is between about 3600 ms and about 8000 ms.

Clause 14. The method of any of the previous clauses, wherein the second exposure schedule indicates that the particular duration of time is about 6000 ms.

Clause 15. The method of any of the previous clauses, wherein the second exposure schedule indicates that the particular duration of time is about 8000 ms, about 7000 ms, about 6500 ms, about 6000 ms, about 5500 ms, about 5000 ms, about 4500 ms, or about 4000 ms.

Clause 16. The method of any of the previous clauses, wherein each of the precursor exposure periods has a lower duty cycle than each of the co-reactant exposure periods.

Clause 17. The method of any of the previous clauses, wherein the duty cycle of a first precursor exposure period of the plurality of precursor exposure periods is one of about 80%, about 70%, about 60%, 50%, about 40%, or about 30%.

Clause 18. The method of any of the previous clauses, wherein the duty cycle of a first co-reactant exposure period of the plurality of co-reactant exposure periods is one of about 80%, about 70%, about 60%, 50%, about 40%, or about 30%.

Clause 19. The method of any of the previous clauses, wherein at least one precursor exposure period at least partially overlaps with at least one co-reactant exposure period.

Clause 20. The method of any of the previous clauses, wherein a thickness of the conformal layer is about 15 nm.

Clause 21. The method of any of the previous clauses, wherein the wherein a temperature of the reaction chamber is between about 300° C. and about 600° C.

Clause 22. The method of any of the previous clauses, wherein the wherein a temperature of the reaction chamber is between about 350° C. and about 525° C.

Clause 23. The method of any of the previous clauses, wherein the wherein a temperature of the reaction chamber is between about 400° C. and about 450° C.

Clause 24. The method of any of the previous clauses, wherein a resistivity of the conformal layer is between about 100 uΩ-cm and about 500 uΩ-cm.

Clause 25. The method of any of the previous clauses, wherein a resistivity of the conformal layer is less than or equal to about 400 uΩ-cm.

Clause 26. The method of any of the previous clauses, wherein a resistivity of the conformal layer is less than or equal to about 300 uΩ-cm.

Clause 27. The method of any of the previous clauses, wherein a resistivity of the conformal layer is approximately ohmic.

Clause 28. The method of any of the previous clauses, wherein the precursor is TDMAT (tetrakis(dimethylamino) titanium).

Clause 29. The method of any of the previous clauses, wherein the precursor is TDEAT (tetrakis(diethylamido) titanium).

Clause 30. The method of any of the previous clauses, wherein the precursor is TEMATi (tetrakis(ethylmethylamido)titanium).

Clause 31. The method of any of the previous clauses, wherein the co-reactant comprises anhydrous hydrazine ($N_2H_4$).

Clause 32. The method of any of the previous clauses, wherein the via is a horizontal via.

Clause 33. The method of any of the previous clauses, wherein via is a horizontal via having an aspect ratio of about 5:1.

Clause 34. The method of any of the previous clauses, wherein via is a horizontal via having an aspect ratio of about 5:2, about 3:2, about 3:1, about 4:3, about 7:2, about 4:1, about 5:3, about 7:3, or about 7:4.

Clause 35. The method of clause 34, wherein the via is a horizontal via having dimensions of about 20 nm by about 100 nm.

Clause 36. The method of any of the previous clauses, wherein the reaction chamber is an epitaxial chamber.

Clause 37. The method of any of the previous clauses, wherein the reaction chamber is an atomic layer deposition (ALD) chamber.

Clause 38. The method of any of the previous clauses, wherein the reaction chamber is at least one of a chemical vapor deposition (CVD) chamber, metal-organic chemical vapor deposition (MOCVD) chamber, or a molecular-beam epitaxy (MBE) chamber.

Clause 39. A conformal layer formed using any of the foregoing methods.

TERMINOLOGY

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

The term "comprise," as used herein, in addition to its regular meaning, may also include, and, in some embodiments, may specifically refer to the expressions "consist essentially of" and/or "consist of" Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of" i.e., wherein that which is claimed may include further elements that do not materially affect the basic and novel characteristic(s) of that which is claimed.

The term "about" generally refers to a range of numeric values that one of skill in the art would consider equivalent to the recited numeric value or having the same function or result. For example, "about" may refer to a range that is within ±1%, ±2%, ±5%, ±7%, ±10%, ±15%, or even ±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an approximation by use of the term "substantially," it will be understood that the particular element forms another embodiment.

The term "substrate," as used herein, can broadly refer to any layer and/or surface upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer deposition and/or atomic layer annealing may be performed on the top layer, or a surface of the top layer, of the stack. In such a case, the top layer may be considered the substrate. In general, the layer or layers upon which the chemical precursor is deposited and/or which reacts with the chemical precursor can be considered the substrate layer(s). The material for the substrate may be any that may be appreciated by one of skill in the art in the field of electronics and/or semiconductors.

The term "atomic layer deposition" (ALD), as used herein, can broadly refer to the level of layer dimensional control that can be achieved at the angstrom (Å) level. Thus, atomic layer deposition may generally correspond to the size of atoms and/or molecules. The average added layer thickness per cycle of ALD can be less than 1 Å (0.1 nm) per deposition cycle, for example, about 0.5 Å, about 0.6 Å, about 0.7 Å, about 0.8 Å, about 0.9 Å, about 1 Å, or more than 1 Å, for example, about 1.1 Å, about 1.2 Å, about 1.3 Å, about 1.4 Å, about 1.5 Å, about 2 Å, about 2.5 Å, about 3 Å, about 4 Å, about 5 Å, about 6 Å, about 7 Å, about 8 Å, about 9 Å, about 10 Å (1 nm), or any number between about 0.1-30 Å per deposition cycle. In some embodiments, the average added layer thickness per cycle is between about 0.1-4 Å, about 0.5-4 Å per deposition cycle, about 0.6-4 Å, about 0.7-4 Å per deposition cycle, about 0.8-4 Å per deposition cycle, about 0.9-4 Å per deposition cycle, or about 1-4 Å per deposition cycle. Similarly, the number of deposition cycles in the ALD process is not particularly limited, and may be any number of cycles that would be appreciated by one of skill in the art. For example, the number of deposition cycles in the process may be between 1 and about 1,000 cycles. In some embodiments, the number of deposition cycles may be between about 1-600 cycles, for example, 1 cycle, about 5 cycles, about 10 cycles, about 20 cycles, about 30 cycles, about 40 cycles, about 50 cycles, about 75 cycles, about 100 cycles, about 150 cycles, about 200 cycles, about 250 cycles, about 300 cycles, about 350 cycles, about 400 cycles, about 450 cycles, about 500 cycles, about 550 cycles, or about 600 cycles, or any number of deposition cycles between and including 1 deposition cycle and about 1,000 deposition cycles. According to some embodiments, a deposition cycle may include exposing the substrate to a pulse, or more than one pulse, for example, 2, 3, 4, 5, 6 pulses, etc. of a chemical precursor, and a pulse, or more than one pulse, for example, 2, 3, 4, 5, 6 pulses, etc. of a co-reactant.

While specific embodiments of the present inventive concept have been shown and described, it should be understood that other modifications, substitutions, and alternatives are apparent to one of ordinary skill in the art. Such modifications, substitutions and alternatives can be made without departing from the spirit and scope of the invention. Various features of the inventive concept should be determined as set forth from the appended claims.

Unless otherwise defined, all technical and scientific terms used herein have the same meaning as commonly understood by one of ordinary skill in the art to which this invention belongs.

Embodiments of the present inventive concept relate to preparation of high thermal conductivity films, for example, high conductivity heat spreader films. Embodiments of the present inventive concept include low-temperature (<400° C.) deposition of polycrystalline metal nitride films, such as, but not limited to, aluminum nitride (AlN) films for use in, for example, heat spreaders; and include use of, for example, an AlN film, or in the alternative, a GaN, film and/or an InN film deposited on a substrate by atomic layer annealing as a buffer/template layer for further crystalline film growth thereon by, for example, sputtering, in the fabrication of films/layers for use as, for example, heat spreaders and/or heat dissipation films/layers.

The term "substrate," as used herein, can broadly refer to any layer and/or surface upon which processing is desired. Thus, for example, a native oxide film on the surface of a silicon substrate may itself be considered a substrate for the purposes of this discussion. Likewise, layers deposited on silicon or on other base substrates may likewise be considered substrates in some embodiments. For example, in some embodiments, a multi-layer stack may be formed, and then atomic layer deposition and/or atomic layer annealing may be performed on the top layer, or a surface of the top layer, of the stack. In such a case, the top layer may be considered the substrate. In general, the layer or layers upon which the chemical precursor is deposited and/or which reacts with the chemical precursor can be considered the substrate layer(s). The material for the substrate may be any that may be appreciated by one of skill in the art in the field of electronics and/or semiconductors. In some embodiments, materials for the substrate include, for example, Si, $SiO_2$/Si, GaN, SiC, GaAs, and/or InGaAs.

The substrate, according to some embodiments, may include, but are not limited to, wafers. The wafers may be of various suitable processing sizes. For example, substrate samples may be on the order of 1 inch or smaller, if desired. Additionally, full wafers of about 200 mm or about 300 mm in diameter, or even larger substrates may be incorporated.

The term "atomic layer deposition" (ALD) and "atomic layer annealing" (ALA), as used herein, can broadly refer to the level of layer dimensional control that can be achieved at the angstrom (Å) level. Thus, atomic layer deposition may generally correspond to the size of atoms and/or molecules. The average added layer thickness per cycle of ALD/ALA can be less than 1 Å (0.1 nm) per deposition cycle, for example, about 0.5 Å, about 0.6 Å, about 0.7 Å, about 0.8 Å, about 0.9 Å, about 1 Å, or more than 1 Å, for example, about 1.1 Å, about 1.2 Å, about 1.3 Å, about 1.4 Å, about 1.5 Å, about 2 Å, about 2.5 Å, about 3 Å, about 4 Å, about 5 Å, about 6 Å, about 7 Å, about 8 Å, about 9 Å, about 10 Å (1 nm), or any number between about 0.1-30 Å per deposition cycle. In some embodiments, the average added layer thickness per cycle is between about 0.1-4 Å, about 0.5-4 Å per deposition cycle, about 0.6-4 Å, about 0.7-4 Å per deposition cycle, about 0.8-4 Å per deposition cycle, about 0.9-4 Å per deposition cycle, or about 1-4 Å per deposition cycle. Similarly, the number of deposition cycles in the ALD/ALA process is not particularly limited, and may be any number of cycles that would be appreciated by one of skill in the art. For example, the number of deposition cycles in the process may be between 1 and about 1,000 cycles. In some embodiments, the number of deposition cycles may be between about 1-600 cycles, for example, 1 cycle, about 5 cycles, about 10 cycles, about 20 cycles, about 30 cycles, about 40 cycles, about 50 cycles, about 75 cycles, about 100 cycles, about 150 cycles, about 200 cycles, about 250 cycles, about 300 cycles, about 350 cycles, about 400 cycles, about 450 cycles, about 500 cycles, about 550 cycles, or about 600 cycles, or any number of deposition cycles between and including 1 deposition cycle and about 1,000 deposition cycles.

Regarding ALA, in addition to, for example, exposing a substrate to at least one cycle of a pulse of an organometallic chemical precursor and a pulse of a co-reactant of a conventional ALD process, optionally including a purge between the pulse, or pulses, of precursor and co-reactant, ALA may include a plasma treatment, such as an inert/noble gas plasma treatment with, for example, argon (Ar), neon (Ne), krypton (Kr), or helium (He) plasma, under a bias voltage, for example, about −5 V, −10 V, about −15 V, about −20 V, about −25 V, about −30 V, about −40 V, about −50 V, or about −75 V bias voltage. In some embodiments, the bias voltage in the plasma treatment is between about −5 V and about −75 V. In some embodiments the bias voltage in the plasma treatment is between about −25 V to about −40 V. The plasma treatment may occur after each ALD cycle, after every other ALD cycle, or regularly after any number of ALD cycles. In some embodiments, the plasma treatment for an ALA is provided after each ALD cycle of an organometallic chemical precursor pulse and a nitrogen-containing co-reactant pulse. In some embodiments, the plasma treatment for an ALA is provided after every other ALD cycle of an organometallic chemical precursor pulse and a nitrogen-containing co-reactant pulse. In some embodiments, the plasma treatment for an ALA is provided after every third ALD cycle of an organometallic chemical precursor pulse and a nitrogen-containing co-reactant pulse.

It will be appreciated that temperatures at which methods of deposition of films/layers of the inventive concept should be such that the methods of deposition are compatible with back end of line (BEOL) processing and integration. In some embodiments, the temperature at which methods of the present inventive concept take place is less than or equal to about 400° C. In some embodiments, the temperature at which methods of the present inventive concept take place is less than or equal to about 450° C., less than or equal to about 500° C., less than or equal to about 550° C., or less than or equal to about 580° C. In some embodiments, the temperature at which methods of the present inventive concept take place is between about and including 350° C. and about and including 400° C. In some embodiments, the temperature at which methods of the present inventive concept take place is between about and including 350° C. and about and including 580° C.

The pressures at which methods and steps in the methods of the present inventive concept are not particularly limited, and may be any pressure that would be envisioned by one of skill in the art to perform the methods and steps in the methods as described herein. For example, the organometallic chemical precursor pulse(s) and the nitrogen-containing co-reactant pulse(s) may be performed at pressures between about $10^{-8}$ Torr to about $10^{-6}$ Torr, or between about $10^{-7}$ Torr to about $10^{-6}$ Torr. The pressures at which the plasma treatment takes place may be between about $10^{-4}$ Torr to about $10^{-2}$ Torr, for example, but not limited to, about $4\times10^{-3}$ Torr or about $5\times10^{-3}$ Torr.

In some embodiments of the present inventive concept, provided is a method for depositing films on a sample and/or substrate for use in, for example, heat dissipating applications, such as for use in heat spreaders, including depositing, for example, AlN, using organometallic chemical precursors, such as, for example, tris(dimethylamido) aluminum (TDMAA) and/or tris(diethylamido) aluminum (TDEAA), in conjunction with nitrogen-containing co-reactants, such as hydrazine ($N_2H_4$) and/or $NH_3$, via ALA using an inert gas plasma, for example, argon (Ar), neon (Ne), krypton (Kr), or helium (He), In some embodiments, the gas used in the plasma treatment is Ar. In some embodiments, the gas used in the plasma treatment is Kr. Crystallinity of the film may be varied by the bias voltage and/or pressure applied during deposition to the sample. The film applied by ALA may be a buffer/template layer, on which a further layer may be grown. In some embodiments, the buffer/template layer may be a strain relief layer on which a thick (e.g., thicker than about 70 nm, such as 200-300 nm thick) polycrystalline layer of AlN may be deposited. In some embodiments, the average grain size of AlN in the layers may be about 6-25 nm, for example, about 6-8 nm, about 10-25 nm, or about 20-25 nm. In some embodiments, the average grain size of the AlN, i.e., AlN crystals, in the layers is greater than about 15 nm, greater than about 16 nm, greater than about 17 nm, greater than about 18 nm, greater than about 19 nm, or greater than about 20 nm in size. In some embodiments, the average grain size of the AlN in the layers is in a range of about 10-30 nm, about 15-30 nm, or about 15-25 nm. In some embodiments, the average grain size of the AlN in the layers may be about 5 nm, about 6 nm, about 7 nm, about 8 nm, about 9 nm, about 10 nm, about 11 nm, about 12 nm, about 13 nm, about 14 nm, about 15 nm, about 16 nm, about 17 nm, about 18 nm, about 19 nm, about 20 nm, about 21 nm, about 22 nm, about 23 nm, about 24 nm, about 25 nm, about 26 nm, about 27 nm, about 28 nm, about 29 nm, or any value between about and including 10 nm and about and including 30 nm, or any value between about and including 15 nm and about and including 30 nm. In some embodiments, the buffer/template layer may be crystalline or polycrystalline in character. In some embodiments, the buffer/template layer may be amorphous in character. In some embodiments, the average grain size of the AlN in the buffer/template layer may be about the same as the thickness of the buffer/template layer on the substrate. In some embodiments, the AlN in the buffer/template layer includes oriented c-axis AlN.

It will be appreciated that in cases in which crystalline layers thicker than about 70 nm are deposited directly on a substrate of Si, such as Si (111) or Si (100), or $SiO_2$/Si or GaN or SiC or GaAs or InGaAs, macroscopic cracks tend to form due to the high compressive stress in the crystalline layer. According to some embodiments of the inventive concept, by using a thin, for example, but not limited to, an about 20-25 nm buffer/template layer of AlN, in some embodiments, oriented c-axis AlN, deposited first on Si or $SiO_2$/Si or GaN or SiC or GaAs or InGaAs, stress in the film grown on top of the buffer layer can be controlled, and a, for example, but not limited to, 290 nm thick crystalline or polycrystalline layer that is primarily (002) and (103) textured AlN can be deposited by, for example, ion plating, by chemical vapor deposition (CVD), metalorganic chemical vapor deposition (MOCVD), or by sputtering/sputter deposition. Accordingly, in some embodiments of the present inventive concept, films that are about 100-500 nm thick, about 100-400 nm thick, about 150-400 nm thick, about 200-400 nm thick, or about 200-300 nm thick having a thermal conductivity of about 70 $Wm^{-1}K^{-1}$, about 80 $Wm^{-1}K^{-1}$, about 90 $Wm^{-1}K^{-1}$, about 100 $Wm^{-1}K^{-1}$, or even greater, can be prepared.

In cases in which the buffer/template layer is deposited by ALA, for example, a 25 nm buffer/template layer deposited by ALA using, for example, precursors such as TDMAA and $N_2H_4$, a 290 nm polycrystalline sputtered AlN layer, for example, can be deposited on the buffer/template layer having crystalline grain sizes of about 20-25 nm, similar to that of the template. By increasing grain size in the film, grain boundaries in the film will be decreased, and greater thermal conductivities than, for example, about 70 $Wm^{-1}K^{-1}$, about 80 $Wm^{-1}K^{-1}$, about 90 $Wm^{-1}K^{-1}$, about 100 $Wm^{-1}K^{-1}$, or even greater, up to the theoretical limit for the thermal conductivity of the material chosen, can be expected for films prepared according to the present inventive concept.

Accordingly, methods of forming a polycrystalline film and/or forming a heat dissipating/heat spreading layer/film on a substrate may include at least one cycle of an ALA process to provide a polycrystalline buffer/template film/layer, followed by deposition of a second polycrystalline film/layer on the polycrystalline buffer/template layer. The method provides a polycrystalline film and/or a heat dissipating/heat spreading layer film with superior characteristics, e.g., larger average crystal/grain size and higher thermal conductivity, as well as may be prepared at lower temperatures than are provided conventionally.

The at least one cycle of an ALA process in the formation of the buffer/template layer according to methods of the inventive concept may include: exposing a surface of a substrate to an organometallic chemical precursor, to provide an organometallic chemical precursor layer on the surface of the substrate; exposing the organometallic chemical precursor, i.e., the layer thereof on the substrate, to a nitrogen-containing co-reactant to provide a metal-nitride layer on the substrate; and treating the metal nitride layer with an inert gas plasma to provide a polycrystalline metal-nitride buffer/template layer. According to embodiments of the inventive concept, the organometallic chemical precursor and the nitrogen-containing co-reactant are not particularly limited, and any such precursor or co-reactant may be used that will provide a metal-nitride film, as would be appreciated by one of skill in the art. In some embodiments, the metal-nitride film/layer provided is aluminum nitride (AlN). In some embodiments, the metal-nitride film/layer provided gallium nitride (GaN). In some embodiments, the metal-nitride film/layer provided indium nitride (InN). In some embodiments, the organometallic chemical precursor is tris(dimethylamido) aluminum (TDMAA). In some embodiments, the organometallic chemical precursor tris (diethylamido) aluminum (TDEAA). In some embodiments, the nitrogen-containing co-reactant is hydrazine ($N_2H_4$). In some embodiments, the nitrogen-containing co-reactant is ammonia ($NH_3$). The inert gas plasma, in some embodiments of the inventive concept, may be an argon (Ar) plasma, and bias voltage and/or pressure during application of the inert gas plasma in the ALA process may be used to impart, alter, and/or vary the crystallinity/polycrystallinity of the buffer/template film/layer.

The buffer/template film/layer provided by embodiments of the inventive concept may serve as a strain relief fil/layer on which a thick polycrystalline metal-nitride film/layer, for example a thick AlN film/layer, may be deposited. Deposition of the thick polycrystalline metal-nitride layer may be performed by, for example, ion plating, CVD, MOCVD, and/or sputtering as will be appreciated by one of skill in the art. In some embodiments, deposition of the thick polycrystalline metal-nitride layer is performed by sputtering. Deposition of this thick polycrystalline metal-nitride film/layer on the buffer/template film/layer, according to embodiments of the inventive concept, can provide a metal-nitride film/layer, for example, an AlN film/layer, having superior characteristics and is suitable for heat dissipating/heat spreading applications in, for example, BEOL applications/integration in electronic/semiconductor devices.

What is claimed:

1. A method of forming a conformal layer including titanium nitride (TiN) in a horizontal via on a substrate in a reaction chamber comprising:

introducing a precursor into the reaction chamber according to a first exposure schedule, wherein the precursor includes non-halogenated metal-organic titanium, wherein the first exposure schedule indicates a plurality of precursor exposure periods, wherein each precursor exposure period of the plurality of precursor exposure periods is associated with a particular duration of time and a particular duty cycle over which to introduce the precursor into the reaction chamber during the particular duration of time;

introducing a co-reactant into the reaction chamber according to a second exposure schedule, wherein the co-reactant includes nitrogen, wherein the second exposure schedule indicates a plurality of co-reactant exposure periods, wherein each co-reactant exposure period of the plurality of co-reactant exposure periods is associated with a particular duration of time and a particular duty cycle over which to introduce the co-reactant into the reaction chamber during the particular duration of time; and providing the conformal layer including TiN in the horizontal via based on said introducing a precursor into the reaction chamber said introducing the co-reactant into the reaction chamber.

2. The method of claim 1, wherein the first exposure schedule indicates that the particular duration of time is between about 100 ms and about 250 ms.

3. The method of claim 1, wherein the second exposure schedule indicates that the particular duration of time is between about 3600 ms and about 8000 ms.

4. The method of claim 1, wherein the second exposure schedule indicates that the particular duration of time is about 6000 ms.

5. The method of claim 1, wherein each of the precursor exposure periods has a lower duty cycle than each of the co-reactant exposure periods.

6. The method of claim 1, wherein the duty cycle of a first precursor exposure period of the plurality of precursor exposure periods is about 50%.

7. The method of claim 1, wherein the duty cycle of a first co-reactant exposure period of the plurality of co-reactant exposure periods is about 75%.

8. The method of claim 1, wherein at least one precursor exposure period at least partially overlaps with at least one co-reactant exposure period.

9. The method of claim 1, wherein a thickness of the conformal layer is about 15 nm.

10. The method of claim 1, wherein the wherein a temperature of the reaction chamber is between about 350° C. and about 525° C.

11. The method of claim 1, wherein the wherein a temperature of the reaction chamber is between about 400° C. and about 450° C.

12. The method of claim 1, wherein a resistivity of the conformal layer is between about 100 uΩ-cm and about 500 uΩ-cm.

13. The method of claim 1, wherein a resistivity of the conformal layer is less than or equal to about 400 uΩ-cm.

14. The method of claim 1, wherein the co-reactant comprises anhydrous hydrazine ($N_2H_4$).

15. The method of claim 1, wherein via is a horizontal via having an aspect ratio of about 5:1.

16. The method of claim 1, wherein the horizontal via has dimensions of about 20 nm by about 100 nm.

17. A method of forming a conformal layer comprising titanium nitride (TiN) on a substrate with a horizontal via within a reaction chamber, the method comprising:
    introducing a precursor comprising titanium into the reaction chamber according to a precursor exposure schedule, wherein the precursor exposure schedule specifies a first duration and a first duty cycle for introduction of the precursor into the reaction chamber; and
    introducing a co-reactant comprising nitrogen into the reaction chamber according to a co-reactant exposure schedule, wherein the co-reactant exposure schedule specifies a second duration and a second duty cycle for introduction of the co-reactant into the reaction chamber, wherein the second duty cycle is greater than the first duty cycle,
    wherein the conformal layer is formed in the horizontal via.

18. The method of claim 17, wherein the reaction chamber is maintained at a temperature between about 350° C. and about 525° C. during formation of the conformal layer, and the conformal layer has a resistivity of less than or equal to about 400 uΩ-cm.

19. The method of claim 17, wherein the precursor comprises a non-halogenated metal-organic titanium compound, and the co-reactant comprises anhydrous hydrazine ($N_2H_4$).

20. The method of claim 17, wherein the horizontal via runs generally parallel to a major surface of the substrate, and wherein the horizontal via has an aspect ratio of about 5:1.

\* \* \* \* \*